United States Patent
Byers et al.

(10) Patent No.: US 11,191,189 B2
(45) Date of Patent: *Nov. 30, 2021

(54) SPLITTING OF COMBINED DELIVERY POWER, DATA, AND COOLING IN A COMMUNICATIONS NETWORK

(71) Applicant: CISCO TECHNOLOGY, INC., San Jose, CA (US)

(72) Inventors: Charles Calvin Byers, Wheaton, IL (US); Joel Richard Goergen, Soulsbyville, CA (US); D. Brice Achkir, Livermore, CA (US); Robert Gregory Twiss, Chapel Hill, NC (US)

(73) Assignee: CISCO TECHNOLOGY, INC., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/819,431

(22) Filed: Mar. 16, 2020

(65) Prior Publication Data
US 2020/0221601 A1    Jul. 9, 2020

Related U.S. Application Data

(63) Continuation of application No. 15/918,972, filed on Mar. 12, 2018, now Pat. No. 10,631,443.

(51) Int. Cl.
*H05K 7/20* (2006.01)
*G06F 1/20* (2006.01)
(Continued)

(52) U.S. Cl.
CPC ............. *H05K 7/208* (2013.01); *F25D 17/08* (2013.01); *G06F 1/189* (2013.01); *G06F 1/20* (2013.01);
(Continued)

(58) Field of Classification Search
CPC ............... H05K 7/208; H05K 7/20763; H05K 7/20218; F25D 17/08; G06F 1/189; G06F 1/20; H04W 40/24
See application file for complete search history.

(56) References Cited

U.S. PATENT DOCUMENTS 3,335,324 A    8/1967   Buckeridge
3,962,529 A    6/1976   Kubo
(Continued)

FOREIGN PATENT DOCUMENTS

CN    1209880 C    7/2005
CN    201689347 U    12/2010
(Continued)

OTHER PUBLICATIONS https://www.fischerconnectors.com/US/en/products/fiberoptic.
(Continued)

*Primary Examiner* — Ziaul Karim

(57) ABSTRACT

In one embodiment, a method includes delivering power and data on a cable from a central network device to a splitter device for splitting and transmitting the power and data to a plurality of remote communications devices over a plurality of cables, each of the cables carrying the power and data, receiving at the central network device, monitoring information from the remote communications devices on the cable, processing the monitoring information, and allocating the power and data to each of the remote communications devices based on the monitoring information. The power and data comprises pulsed power and optical data. A system is also disclosed herein.

20 Claims, 8 Drawing Sheets

(51) Int. Cl.
  *H04W 40/24* (2009.01)
  *G06F 1/18* (2006.01)
  *F25D 17/08* (2006.01)
  *H04Q 1/02* (2006.01)
  *G06F 1/26* (2006.01)
  *H04L 12/10* (2006.01)

(52) U.S. Cl.
  CPC .............. *G06F 1/26* (2013.01); *H04L 12/10* (2013.01); *H04Q 1/02* (2013.01); *H04W 40/24* (2013.01); *H05K 7/20218* (2013.01); *H05K 7/20763* (2013.01)

(56) References Cited

U.S. PATENT DOCUMENTS

| | | | |
|---|---|---|---|
| 4,811,187 A | 3/1989 | Nakajima | |
| 4,997,388 A | 3/1991 | Dale | |
| 5,652,893 A | 7/1997 | Ben-Meir | |
| 6,008,631 A | 12/1999 | Johari | |
| 6,220,955 B1 | 4/2001 | Posa | |
| 6,259,745 B1 | 7/2001 | Chan | |
| 6,636,538 B1 | 10/2003 | Stephens | |
| 6,685,364 B1 | 2/2004 | Brezina | |
| 6,784,790 B1 | 8/2004 | Lester | |
| 6,826,368 B1 | 11/2004 | Koren | |
| 6,855,881 B2 * | 2/2005 | Khoshnood | G02B 6/3817 174/15.1 |
| 6,860,004 B2 | 3/2005 | Hirano | |
| 7,325,150 B2 * | 1/2008 | Lehr | G06F 1/26 713/300 |
| 7,420,355 B2 | 9/2008 | Liu | |
| 7,490,996 B2 | 2/2009 | Sommer | |
| 7,492,059 B2 | 2/2009 | Peker | |
| 7,509,505 B2 | 3/2009 | Randall | |
| 7,566,987 B2 | 7/2009 | Black et al. | |
| 7,583,703 B2 | 9/2009 | Bowser | |
| 7,589,435 B2 | 9/2009 | Metsker | |
| 7,593,747 B1 | 9/2009 | Karam | |
| 7,603,570 B2 | 10/2009 | Schindler | |
| 7,616,465 B1 | 11/2009 | Vinciarelli | |
| 7,813,646 B2 | 10/2010 | Furey | |
| 7,835,389 B2 | 11/2010 | Yu | |
| 7,854,634 B2 | 12/2010 | Filipon | |
| 7,881,072 B2 | 2/2011 | DiBene | |
| 7,915,761 B1 | 3/2011 | Jones | |
| 7,921,307 B2 | 4/2011 | Karam | |
| 7,924,579 B2 | 4/2011 | Arduini | |
| 7,940,787 B2 | 5/2011 | Karam | |
| 7,973,538 B2 | 7/2011 | Karam | |
| 8,020,043 B2 | 9/2011 | Karam | |
| 8,037,324 B2 | 10/2011 | Hussain | |
| 8,081,589 B1 | 12/2011 | Gilbrech | |
| 8,184,525 B2 | 5/2012 | Karam | |
| 8,276,397 B1 | 10/2012 | Carlson | |
| 8,279,883 B2 | 10/2012 | Diab | |
| 8,310,089 B2 | 11/2012 | Schindler | |
| 8,319,627 B2 | 11/2012 | Chan | |
| 8,345,439 B1 | 1/2013 | Goergen | |
| 8,350,538 B2 | 1/2013 | Cuk | |
| 8,358,893 B1 | 1/2013 | Sanderson | |
| 8,386,820 B2 | 2/2013 | Diab | |
| 8,638,008 B2 | 1/2014 | Baldwin et al. | |
| 8,700,923 B2 | 4/2014 | Fung | |
| 8,712,324 B2 | 4/2014 | Corbridge | |
| 8,750,710 B1 | 6/2014 | Hirt | |
| 8,768,528 B2 | 7/2014 | Millar et al. | |
| 8,781,637 B2 | 7/2014 | Eaves | |
| 8,787,775 B2 | 7/2014 | Earnshaw | |
| 8,829,917 B1 | 9/2014 | Lo | |
| 8,836,228 B2 | 9/2014 | Xu | |
| 8,842,430 B2 | 9/2014 | Hellriegel | |
| 8,849,471 B2 | 9/2014 | Daniel | |
| 8,966,747 B2 | 3/2015 | Vinciarelli | |
| 9,019,895 B2 | 4/2015 | Li | |
| 9,024,473 B2 | 5/2015 | Huff | |
| 9,184,795 B2 | 11/2015 | Eaves | |
| 9,189,036 B2 | 11/2015 | Ghoshal | |
| 9,189,043 B2 | 11/2015 | Vorenkamp | |
| 9,273,906 B2 | 3/2016 | Goth | |
| 9,319,101 B2 | 4/2016 | Lontka | |
| 9,321,362 B2 | 4/2016 | Woo | |
| 9,373,963 B2 | 6/2016 | Kuznelsov | |
| 9,419,436 B2 | 8/2016 | Eaves | |
| 9,484,771 B2 | 11/2016 | Braylovskiy | |
| 9,510,479 B2 | 11/2016 | Vos | |
| 9,531,551 B2 | 12/2016 | Balasubramanian | |
| 9,590,811 B2 | 3/2017 | Hunter, Jr. | |
| 9,618,714 B2 | 4/2017 | Murray | |
| 9,640,998 B2 | 5/2017 | Dawson | |
| 9,665,148 B2 | 5/2017 | Hamdi | |
| 9,693,244 B2 | 6/2017 | Maruhashi | |
| 9,734,940 B1 | 8/2017 | McNutt | |
| 9,853,689 B2 | 12/2017 | Eaves | |
| 9,874,930 B2 | 1/2018 | Vavilala | |
| 9,882,656 B2 | 1/2018 | Sipes, Jr. | |
| 9,893,521 B2 | 2/2018 | Lowe | |
| 9,948,198 B2 | 4/2018 | Imai | |
| 9,979,370 B2 | 5/2018 | Xu | |
| 9,985,600 B2 | 5/2018 | Xu | |
| 10,007,628 B2 | 6/2018 | Pitigoi-Aron | |
| 10,028,417 B2 | 7/2018 | Schmidtke | |
| 10,128,764 B1 | 11/2018 | Vinciarelli | |
| 10,248,178 B2 | 4/2019 | Brooks | |
| 10,263,526 B2 | 4/2019 | Sandusky et al. | |
| 10,407,995 B2 | 9/2019 | Moeny | |
| 10,439,432 B2 | 10/2019 | Eckhardt | |
| 10,541,543 B2 | 1/2020 | Eaves | |
| 10,735,105 B2 | 8/2020 | Goergen et al. | |
| 2001/0024373 A1 | 9/2001 | Cuk | |
| 2002/0126967 A1 | 9/2002 | Panak | |
| 2004/0000816 A1 | 1/2004 | Khoshnood | |
| 2004/0033076 A1 | 2/2004 | Song | |
| 2004/0043651 A1 | 3/2004 | Bain | |
| 2004/0073703 A1 | 4/2004 | Boucher | |
| 2004/0264214 A1 | 12/2004 | Xu | |
| 2005/0044431 A1 * | 2/2005 | Lang | G06F 1/266 713/300 |
| 2005/0197018 A1 | 9/2005 | Lord | |
| 2005/0268120 A1 | 12/2005 | Schindler | |
| 2006/0202109 A1 | 9/2006 | Delcher | |
| 2006/0209875 A1 | 9/2006 | Lum | |
| 2007/0103168 A1 | 5/2007 | Batten | |
| 2007/0143508 A1 | 6/2007 | Linnman | |
| 2007/0173202 A1 * | 7/2007 | Binder | H04B 7/15542 455/68 |
| 2007/0236853 A1 | 10/2007 | Crawley | |
| 2007/0263675 A1 | 11/2007 | Lum | |
| 2007/0284946 A1 | 12/2007 | Robbins | |
| 2007/0288125 A1 | 12/2007 | Quaratiello | |
| 2008/0054720 A1 | 3/2008 | Lum | |
| 2008/0198635 A1 | 8/2008 | Hussain | |
| 2008/0229120 A1 | 9/2008 | Diab | |
| 2008/0310067 A1 | 12/2008 | Diab | |
| 2009/0027033 A1 | 1/2009 | Diab | |
| 2009/0132679 A1 * | 5/2009 | Binder | H04L 67/02 709/217 |
| 2010/0077239 A1 | 3/2010 | Diab | |
| 2010/0117808 A1 | 5/2010 | Karam | |
| 2010/0171602 A1 | 7/2010 | Kabbara | |
| 2010/0190384 A1 | 7/2010 | Lanni | |
| 2010/0237846 A1 | 9/2010 | Vetteth | |
| 2010/0290190 A1 * | 11/2010 | Chester | H05K 7/20772 361/701 |
| 2011/0004773 A1 | 1/2011 | Hussain | |
| 2011/0007664 A1 | 1/2011 | Diab | |
| 2011/0057612 A1 | 3/2011 | Taguchi | |
| 2011/0083824 A1 | 4/2011 | Rogers | |
| 2011/0228578 A1 | 9/2011 | Serpa | |
| 2011/0266867 A1 | 12/2011 | Schindler | |
| 2011/0290497 A1 | 12/2011 | Stenevik | |
| 2012/0043935 A1 | 2/2012 | Dyer | |
| 2012/0064745 A1 | 3/2012 | Ottliczky | |
| 2012/0170927 A1 | 7/2012 | Huang | |

(56) References Cited

U.S. PATENT DOCUMENTS

| | | |
|---|---|---|
| 2012/0201089 A1 | 8/2012 | Barth |
| 2012/0231654 A1 | 9/2012 | Conrad |
| 2012/0287984 A1 | 11/2012 | Lee |
| 2012/0317426 A1 | 12/2012 | Hunter, Jr. |
| 2012/0319468 A1 | 12/2012 | Schneider |
| 2013/0077923 A1 | 3/2013 | Weem |
| 2013/0079633 A1 | 3/2013 | Weem |
| 2013/0103220 A1 | 4/2013 | Eaves |
| 2013/0249292 A1 | 9/2013 | Blackwell, Jr. |
| 2013/0272721 A1 | 10/2013 | Veen |
| 2013/0329344 A1 | 12/2013 | Tucker |
| 2014/0111180 A1 | 4/2014 | Vladan |
| 2014/0126151 A1 | 5/2014 | Campbell |
| 2014/0129850 A1 | 5/2014 | Paul |
| 2014/0258742 A1 | 9/2014 | Chien |
| 2014/0258813 A1 | 9/2014 | Lusted |
| 2014/0265550 A1 | 9/2014 | Milligan |
| 2014/0355204 A1* | 12/2014 | Gusat .............. H05K 7/20763 361/679.53 |
| 2014/0372773 A1 | 12/2014 | Heath |
| 2015/0078740 A1 | 3/2015 | Sipes, Jr. |
| 2015/0106539 A1 | 4/2015 | Leinonen |
| 2015/0115741 A1 | 4/2015 | Dawson |
| 2015/0207317 A1 | 7/2015 | Radermacher |
| 2015/0215001 A1 | 7/2015 | Eaves |
| 2015/0215131 A1 | 7/2015 | Paul |
| 2015/0333918 A1 | 11/2015 | White, III |
| 2015/0340818 A1 | 11/2015 | Scherer |
| 2015/0375695 A1* | 12/2015 | Grimm ................ B60R 16/023 701/1 |
| 2016/0018252 A1 | 1/2016 | Hanson |
| 2016/0020911 A1 | 1/2016 | Sipes, Jr. |
| 2016/0064938 A1 | 3/2016 | Balasubramanian |
| 2016/0111877 A1 | 4/2016 | Eaves |
| 2016/0118784 A1 | 4/2016 | Saxena |
| 2016/0133355 A1 | 5/2016 | Glew |
| 2016/0134331 A1 | 5/2016 | Eaves |
| 2016/0142217 A1 | 5/2016 | Gardner |
| 2016/0188427 A1 | 6/2016 | Chandrashekar |
| 2016/0197600 A1 | 7/2016 | Kuznetsov |
| 2016/0365967 A1 | 7/2016 | Tu |
| 2016/0241148 A1 | 8/2016 | Kizilyalli |
| 2016/0262288 A1 | 9/2016 | Chainer |
| 2016/0273722 A1 | 9/2016 | Crenshaw |
| 2016/0294500 A1 | 10/2016 | Chawgo |
| 2016/0294568 A1 | 10/2016 | Chawgo et al. |
| 2016/0308683 A1 | 10/2016 | Pischl |
| 2016/0352535 A1 | 12/2016 | Hiscock |
| 2017/0041152 A1 | 2/2017 | Sheffield |
| 2017/0041153 A1 | 2/2017 | Picard |
| 2017/0054296 A1 | 2/2017 | Daniel |
| 2017/0110871 A1 | 4/2017 | Foster |
| 2017/0123466 A1 | 5/2017 | Carnevale |
| 2017/0146260 A1 | 5/2017 | Ribbich |
| 2017/0155517 A1 | 6/2017 | Cao |
| 2017/0155518 A1 | 6/2017 | Yang |
| 2017/0164525 A1 | 6/2017 | Chapel |
| 2017/0214236 A1 | 7/2017 | Eaves |
| 2017/0229886 A1 | 8/2017 | Eaves |
| 2017/0234738 A1 | 8/2017 | Ross |
| 2017/0244318 A1 | 8/2017 | Giuliano |
| 2017/0248976 A1 | 8/2017 | Moller |
| 2017/0294966 A1 | 10/2017 | Jia |
| 2017/0325120 A1 | 11/2017 | Wendt |
| 2018/0024964 A1 | 1/2018 | Mao |
| 2018/0053313 A1 | 2/2018 | Smith |
| 2018/0054083 A1 | 2/2018 | Hick |
| 2018/0060269 A1 | 3/2018 | Kessler |
| 2018/0088648 A1 | 3/2018 | Otani |
| 2018/0098201 A1 | 4/2018 | Torello |
| 2018/0102604 A1 | 4/2018 | Keith |
| 2018/0123360 A1 | 5/2018 | Eaves |
| 2018/0159430 A1 | 6/2018 | Albert |
| 2018/0188712 A1 | 7/2018 | MacKay |
| 2018/0191513 A1 | 7/2018 | Hess |
| 2018/0254624 A1 | 9/2018 | Son |
| 2018/0313886 A1 | 11/2018 | Mlyniec |
| 2019/0126764 A1 | 5/2019 | Fuhrer |
| 2019/0267804 A1 | 8/2019 | Matan |
| 2019/0280895 A1 | 9/2019 | Mather |

FOREIGN PATENT DOCUMENTS

| | | |
|---|---|---|
| CN | 204836199 U | 12/2015 |
| CN | 205544597 | 8/2016 |
| CN | 104081237 B | 10/2016 |
| CN | 104412541 B | 5/2019 |
| EP | 1936861 | 6/2008 |
| EP | 2120443 | 11/2009 |
| EP | 2257009 A2 | 1/2010 |
| EP | 2693688 | 2/2014 |
| WO | WO199316407 A1 | 8/1993 |
| WO | WO2010053542 | 5/2010 |
| WO | WO2017054030 | 4/2017 |
| WO | WO2017167926 A1 | 10/2017 |
| WO | WO2018017544 A1 | 1/2018 |
| WO | WO2019023731 A1 | 2/2019 |

OTHER PUBLICATIONS http://www.strantech.com/products/tfoca-genx-hybrid-2x2-fiber-optic-copper-connector/.
http://www.qpcfiber.com/product/connectors/e-link-hybrid-connector/.
https://www.lumentum.com/sites/default/files/technical-library-items/poweroverfiber-tn-pv-ae_0.pdf.
"Network Remote Power Using Packet Energy Transfer", Eaves et al., www.voltserver.com, Sep. 2012.
Product Overview, "Pluribus VirtualWire Solution", Pluribus Networks, PN-PO-VWS-05818, https://www.pluribusnetworks.com/assets/Pluribus-VirtualWire-PO-50918.pdf, May 2018, 5 pages.
Implementation Guide, "Virtual Chassis Technology Best Practices", Juniper Networks, 8010018-009-EN, Jan. 2016, https://wwwjuniper.net/US/en/local/pdf/implementation-guides/8010018-en.pdf, 29 pages.
Yencheck, Thermal Modeling of Portable Power Cables, 1993.
Zhang, Machine Learning-Based Temperature Prediction for Runtime Thermal Management across System Components, Mar. 2016.
Data Center Power Equipment Thermal Guidelines and Best Practices.
Dynamic Thermal Rating of Substation Terminal Equipment by Rambabu Adapa, 2004.
Chen, Real-Time Termperature Estimation for Power MOSEFETs Conidering Thermal Aging Effects:, IEEE Trnasactions on Device and Materials Reliability, vol. 14, No. 1, Mar. 2014.
Jingquan Chen et al.: "Buck-boost PWM converters having two independently controlled switches", 32nd Annual IEEE Power Electronics Specialists Conference. PESC 2001. Conference Proceedings, Vancouver, Canada, Jun. 17-21, 2001; [Annual Power Electronics Specialists Conference], New York, NY: IEEE, US, vol. 2,Jun. 17, 2001 (Jun. 17, 2001), pp. 736-741, XP010559317, DOI: 10.1109/PESC.2001.954206, ISBN 978-0-7803-7067-8 paragraph [SectionII]; figure 3.
Cheng K W E et al.: "Constant Frequency, Two-Stage Quasiresonant Convertor", IEE Proceedings B. Electrical Power Applications, 1271980 1, vol. 139, No. 3, May 1, 1992 (May 1, 1992), pp. 227-237, XP000292493, the whole document.
Petition for Post Grant Review of U.S. Pat. No. 10,735,105 [Public], filed Feb. 16, 2021, PGR 2021-00055.
Petition for Post Grant Review of U.S. Pat. No. 10,735,105 [Public], filed Feb. 16, 2021, PGR 2021-00056.
Eaves, S. S., Network Remote Powering Using Packet Energy Transfer, Proceedings of IEEE International Conference on Telecommunications Energy (INTELEC) 2012, Scottsdale, AZ, Sep. 30-Oct. 4, 2012 (IEEE 2012) (EavesIEEE).
Edelstein S., Updated 2016 Tesla Model S also gets new 75-kWhbattery option, (Jun. 19, 2016), archived Jun. 19, 2016 by Internet Archive Wayback machine at https://web.archive.org/web/

(56) References Cited

OTHER PUBLICATIONS

20160619001148/https://www.greencarreports.com/news/1103 782_updated-2016-tesla-model-s-also-gets-new-7 5-kwh-battery-option ("Edelstein").
NFPA 70 National Electrical Code, 2017 Edition ("NEC").
International Standard IEC 62368-1 Edition 2.0 (2014), ISBN 978-2-8322-1405-3 ("IEC-62368").
International Standard IEC/TS 60479-1 Edition 4.0 (2005), ISBN 2-8318-8096-3 ("IEC-60479").
International Standard IEC 60950-1 Edition 2.2 (2013), ISBN 978-2-8322-0820-5 ("IEC-60950").
International Standard IEC 60947-1 Edition 5.0 (2014), ISBN 978-2-8322-1798-6 ("IEC-60947").
Tanenbaum, A. S., Computer Networks, Third Edition (1996) ("Tanenbaum").
Stallings, W., Data and Computer Communications, Fourth Edition (1994) ("Stallings").
Alexander, C. K., Fundamentals of Electric Circuits, Indian Edition (2013) ("Alexander").
Hall, S. H., High-Speed Digital System Design, A Handbook of Interconnect Theory and Design Practices (2000) ("Hall").
Sedra, A. S., Microelectronic Circuits, Seventh Edition (2014) ("Sedra").
Lathi, B. P., Modem Digital and Analog Communication Systems, Fourth Edition (2009) ("Lathi").
Understanding 802.3at PoE Plus Standard Increases Available Power (Jun. 2011) ("Microsemi").

\* cited by examiner

SPLITTING OF COMBINED DELIVERY POWER, DATA, AND COOLING IN A COMMUNICATIONS NETWORK

STATEMENT OF RELATED APPLICATION

The present application is a continuation of U.S. patent application Ser. No. 15/918,972, entitled SPLITTING OF COMBINED DELIVERY POWER, DATA, AND COOLING IN A COMMUNICATIONS NETWORK, filed Mar. 12, 2018, which is hereby incorporated by reference in its entirety.

TECHNICAL FIELD

The present disclosure relates generally to communications networks, and more particularly, to splitting combined delivery power, data, and cooling in a communications network.

BACKGROUND

Network devices such as computer peripherals, network access points, and IoT (Internet of Things) devices may have both their data connectivity and power needs met over a single combined function cable such as PoE (Power over Ethernet). In conventional PoE systems, power is delivered over the cables used by the data over a range from a few meters to about one hundred meters. When a greater distance is needed or fiber optic cables are used, power is typically supplied through a local power source such as a nearby wall outlet due to limitations with capacity, reach, and cable loss in conventional PoE. Today's PoE systems also have limited power capacity, which may be inadequate for many classes of devices. If the available power over combined function cables is increased, cooling may also need to be delivered to the high powered remote devices. Use of point-to-point architectures for combined function cables may result in complex and expensive cable systems.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
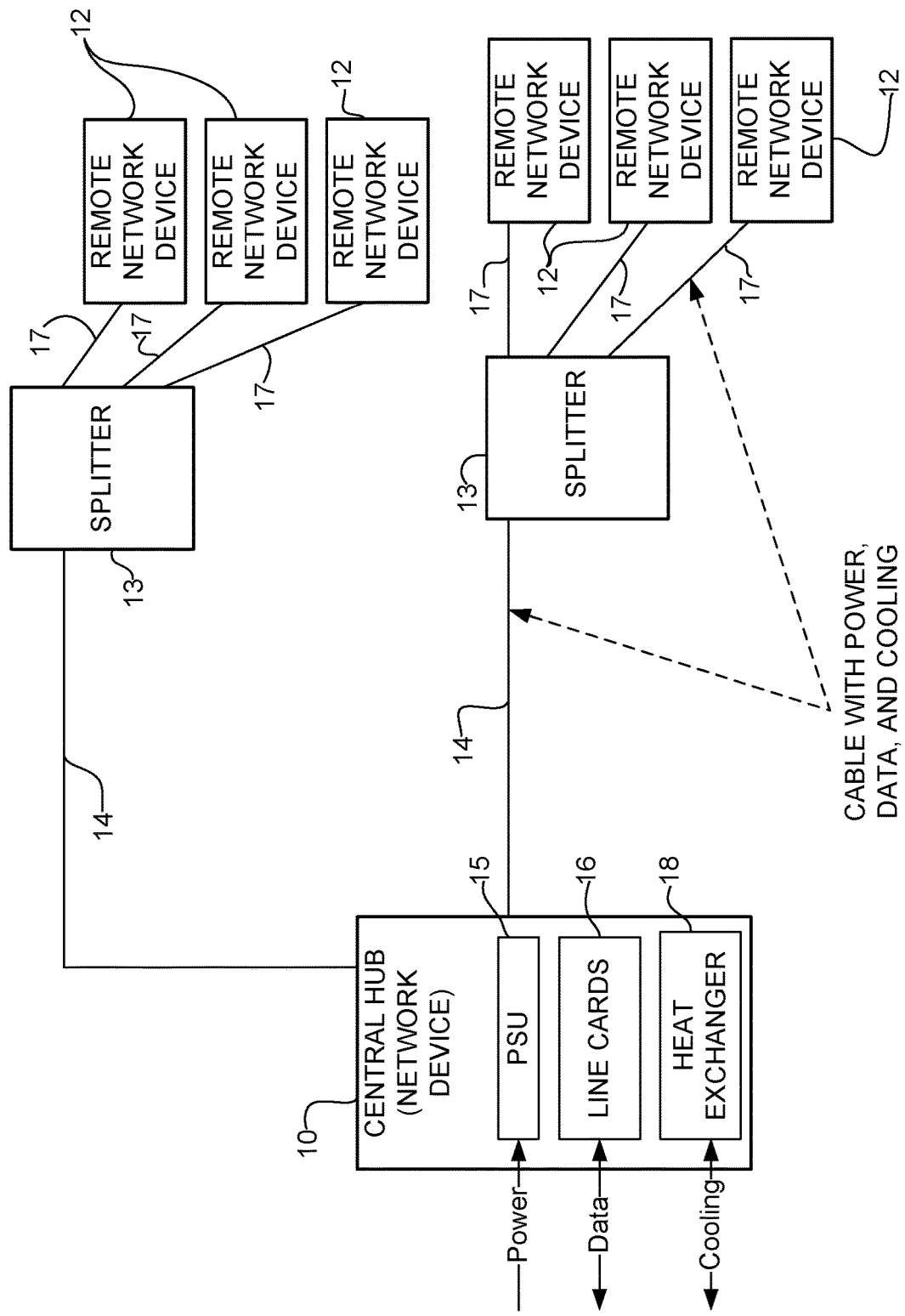
FIG. 1 illustrates an example of a network in which embodiments described herein may be implemented.

In one embodiment, a method generally comprises delivering power, data, and cooling on a cable from a central network device to a splitter device for splitting and transmitting the power, data, and cooling to a plurality of remote communications devices over a plurality of cables, each of the cables carrying the power, data, and cooling, receiving at the central network device, monitoring information from the remote communications devices on the cable, processing the monitoring information, and allocating the power, data, and cooling to each of the remote communications devices based on the monitoring information.

In another embodiment, a method generally comprises receiving at a communications device, power, data, and cooling from a splitter device receiving the power, data, and cooling on a combined cable from a central network device and splitting the power, data, and cooling among a plurality of communications devices, monitoring the power, data, and cooling at the communications device, transmitting monitoring information to the central network device through the splitter device and on the combined cable, and modifying at least one of power, data, and cooling settings in response to a control system message from the central network device allocating the power, data, and cooling to the communications devices.

In another embodiment, a system generally comprises a central network device comprising a connector for connection to a cable delivering power, data, and cooling to a splitter device for splitting the power, data, and cooling for delivery to a plurality of remote communications devices over a plurality of cables, each of the cables carrying the power, data, and cooling, the remote communications devices comprising sensors for monitoring the power, data, and cooling, and a control system for receiving power, data, and cooling information for the remote communications devices and allocating the power, data, and cooling to the remote communications devices.

Further understanding of the features and advantages of the embodiments described herein may be realized by reference to the remaining portions of the specification and the attached drawings.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

In conventional Power over Ethernet (PoE) systems used to simultaneously transmit power and data communications, power is delivered over the same twisted pair cable used for data. These systems are limited in range to a few meters to about 100 meters. The maximum power delivery capacity of standard PoE is approximately 100 Watts, but many classes of powered devices would benefit from power delivery of 1000 Watts or more. In conventional systems, when a larger distance is needed, fiber optic cabling is used to deliver data and when larger power delivery ratings are needed, power is supplied to a remote device through a local power source.

As previously noted, it is desirable to increase the power available over multi-function cables to hundreds and even thousands of watts. This capability may enable many new choices in network deployments where major devices such as workgroup routers, multi-socket servers, large displays, wireless access points, fog nodes, or other devices are operated over multi-function cables. This capability would greatly decrease installation complexity and improve the total cost of ownership of a much wider set of devices that have their power and data connectivity needs met from a central hub.

Beyond the data and power supply capabilities noted above, there is also a need for cooling. For high-powered devices, especially those with high thermal density packaging or total dissipation over a few hundred Watts, traditional convection cooling methods may be inadequate. This is particularly apparent where special cooling challenges are present, such as with a device that is sealed and cannot rely on drawing outside air (e.g., all-season outdoor packaging), a hermetically sealed device (e.g., used in food processing or explosive environments), or where fan noise is a problem (e.g., office or residential environments), or any combination of the above along with extreme ambient temperature environments. In these situations, complex and expensive specialized cooling systems are often used.

In order to overcome the above issues, PoE may be augmented to allow it to carry higher data rates, higher power delivery, and integrated thermal management cooling combined into a single cable, as described, for example, in U.S. patent application Ser. No. 15/910,203 ("Combined Power, Data, and Cooling Delivery in a Communications Network"), filed Mar. 2, 2018, which is incorporated herein by reference in its entirety. These connections may be point-to-point, such as from a central hub to one or more remote devices (e.g., full hub and spoke layout). However, there may be topologies in which it is difficult, not convenient, or inefficient to run power, data, and cooling cables from every remote device all the way to the central hub. For example, use of point-to-point architectures for combined function cables may result in complex and expensive cable systems due to the long, largely parallel cables that may be routed along similar paths to serve clusters of remote devices. If a single combined function cable could be run most of the way to this cluster, and then split, significant savings could be realized.

The embodiments described herein provide for splitting of power, data, and cooling delivered over a combined cable. In one or more embodiments, a single cable carries power, data, and cooling from a central hub to a remote splitting device, which directs a share of all three services to a plurality of endpoint (remote) devices that utilize the services. This allows for use of a single long combined cable from the central hub to an intermediary location for subsequent splitting of the combined power, data, and cooling and delivery to multiple remote devices with short combined cable runs. As described below, the central hub may deliver power, data, and cooling over combined cables to a plurality of intermediate hubs, which divide the power, data, and cooling capabilities for delivery on combined cables in communication with the remote communications devices. The total length and cost of the cable needed to serve a number of remote devices can be minimized through optimal location of the distribution splitter physically near a cluster of remote devices. The embodiments allow a combined cable delivery network to go beyond a point-to-point topology and form passive stars, busses, tapers, multi-layer trees, and the like.

The splitting of combined delivery power, data, and cooling may be particularly beneficial if the remote devices are clustered in relatively high-density groupings served by a comparatively long cable distance back to a central hub. For example, the splitting of services may be beneficial when there are many IoT sensors in close proximity to each other but far away from the central hub, in data centers where a rack full of devices may be run over a shared cable hundreds of meters from the central infrastructure, residential or smart ceiling applications, IoT and server networks such as Top of Rack (ToR) devices, manholes, ceiling junction boxes, roadside cabinets, multi-unit apartment buildings, or any other application in which it is advantageous to have short cable runs from an intermediary device to clustered remote devices. The remote branching topology may greatly reduce large expenses in purchasing, installing, and maintaining long individual cables to each device. As an additional benefit, it is helpful if the splitting of the data, power, and cooling is performed passively (i.e., not requiring active elements such as data routers, power switching, or active flow regulating components that complicate the intermediary split point) since the splitter may be located in inaccessible, environmentally hostile, or mechanically constrained places.

In one or more embodiments, a cable system, referred to herein as PoE+Fiber+Cooling (PoE+F+C), provides high power energy delivery, fiber delivered data, and cooling within a single cable. The PoE+F+C system allows high power devices to be located in remote locations, extreme temperature environments, or noise sensitive environments, with their cooling requirements met through the same cable that carries data and power. The use of a single cable for all interconnect features needed by a remote device greatly simplifies installation and ongoing operation of the device.

Referring now to the drawings, and first to FIG. 1, an example of a network in which embodiments described herein may be implemented is shown. For simplification, only a small number of nodes are shown. The embodiments operate in the context of a data communications network including multiple network devices. The network may include any number of network devices in communication via any number of nodes (e.g., routers, switches, gateways, controllers, access points, or other network devices), which facilitate passage of data within the network. The network devices may communicate over or be in communication with one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, IoT network, optical network, Internet, intranet, or any other network).

The network is configured to provide power (e.g., power greater than 100 Watts), data (e.g., optical data), and cooling from a central network device 10 to a plurality of remote network devices 12 (e.g., switches, routers, servers, access points, computer peripherals, IoT devices, fog nodes, or other electronic components and devices) through one or more splitter devices 13. Signals may be exchanged among communications equipment and power transmitted from power sourcing equipment (PSE) (e.g., central hub 10) to powered devices (PDs) (e.g., remote communications devices 12). The PoE+F+C system delivers power, data, and cooling through one or more splitter devices 13, to a network (e.g., switch/router system) configured to receive data, power, and cooling over a cabling system comprising optical fibers, electrical wires (e.g., copper wires), and coolant tubes. The splitter 13 allows the network to go beyond point-to-point topologies and build passive stars, busses, tapers, multi-layer trees, etc. A single long PoE+F+C cable 14 runs to a conveniently located intermediary splitter device 13 servicing a cluster of physically close endpoint devices (remote network devices, remote communications devices) 12. As described in detail below, control systems for the power, data, and cooling interact between the central hub 10 and the remote devices 12 to ensure that each device receives its fair share of each resource and that faults or dangerous conditions are detected and managed.

As shown in the example of FIG. 1, the PoE+F+C splitter system comprises the central hub 10 in communication with the remote devices 12 via the splitter device (distribution splitter, passive splitter) 13. Cables 14 extend from the central hub 10 to the splitters 13 and cables 17 extend from the splitters to the remote network devices 12. Each cable 14, 17 is configured for delivering power, data, and cooling. The central hub 10 may be in communication with any number of splitters 13, and each splitter may be in communication with any number of remote devices 12 for splitting services (power, data, cooling) any number of ways. For example, the central hub 10 may serve anywhere from a few remote devices 12 to hundreds of remote devices (or any number in between) via one or more splitters 13. Also, as described below, one or more of the splitters 13 may be in communication with another splitter to provide layered splitting.

The network may include any number or arrangement of network communications devices (e.g., switches, access points, routers, or other devices operable to route (switch, forward) data communications). The remote devices 12 may be located at distances greater than 100 meters (e.g., 1 km, 10 km, or any other distance) from the central hub 10, and/or operate at greater power levels than 100 Watts (e.g., 250 Watts, 1000 Watts, or any other power level). The remote devices 12 may also be in communication with one or more other devices (e.g., fog node, IoT device, sensor, and the like), as described below.

In one or more embodiments, a redundant central hub (not shown) may provide backup or additional power, bandwidth, or cooling, as needed in the network. Additional combined cables 14 would run from the redundant central hub to one or more of the splitter devices 13.

In the example shown in FIG. 1, the central hub 10 comprises a power supply unit (PSU) (power distribution module) 15 for receiving power (e.g., building power from a power grid, renewable energy source, generator, or battery), a network interface (e.g., fabric, line cards) 16 for receiving data from or transmitting data to a network (e.g., Internet), and a heat exchanger 18 in fluid communication with a cooling plant (or other cooling source).

The central hub 10 may be operable to provide high capacity power from an internal power system (e.g., PSU 15 capable of delivering power over and including 5 kW, 100 kW, etc., and driving the plurality of devices 12 in the 100-3000 W range). The PSU 15 may provide, for example, PoE, pulsed power, DC power, or AC power. The central hub 10 (PSE (Power Sourcing Equipment)) is operable to receive power external from a communications network and transmit the power, along with data and cooling to the remote network devices (PDs (Powered Devices)) 12 through the splitters 13. The central hub 10 may comprise, for example, a router, convergence device, or any other suitable network device operable to deliver power, data, and cooling. As described in detail below, the central hub 10 provides control logic for the cooling loop, as well as the power and data transport functions of the combined cable 14, 17. Additional components and functions of the central hub 10 are described below with respect to FIG. 2.

The splitter device 13 is operable to split the optical energy N ways, split the power N ways, and split and recombine coolant flows N ways, thereby splitting and directing a portion of the data, power, and cooling (thermal management) capabilities supplied by the main cable 14 from the central hub 10, enabling the power, data, and, cooling to be shared by a number of the remote devices 12. The splitter 13 may be configured to provide any suitable split ratio (e.g., 2:1 up to about 32:1). If the network contains multiple splitters 13 as shown in FIG. 1, each splitter may have the same or different split ratio. All of the splitting may occur in one place, or layers of splitting with different lengths of cable between tiered layers may be used (e.g., for performing a 32:1 split as a sequential tree of five layers of 2:1 splits, or a star-of-stars topology). If a multi-drop bus or taper topology is used, special splitters 13 may be configured to direct most of the power, coolant, and optical energy from an input port to a daisy-chain output port, with just a small portion of the resources directed to a local drop port. This may be used to support applications such as roadside fog nodes, security cameras, light fixtures, or any other application that has a natural bus or taper topology, for example.

In one or more embodiments, the splitter 13 is a passive device, requiring no active electronics, routers, valves, or computer control. In an alternate embodiment, more advanced splitting scenarios may place some intelligence and active control elements in the intermediary splitter site. For example, the splitter may be active with respect to optical data and passive with respect to power and cooling.

As previously noted, cables 14 extending from the central hub 10 to the splitter devices 13 and cables 17 extending from the splitter devices to the remote network devices 12 are configured to transmit power, data, and cooling in a single cable (combined cable, multi-function cable, multi-use cable, hybrid cable). The cables 14, 17 may be formed from any material suitable to carry electrical power, data (copper, fiber), and coolant (liquid, gas, or multi-phase) and may carry any number of electrical wires, optical fibers, and cooling tubes in any arrangement.

In the example shown in FIG. 1, a long stretch of the combined cable 14 runs from the central hub 10 to the splitter 13, at which the power, data, and cooling are split and delivered to a plurality of the remote devices 12 over cables 17, which are also configured to carry combined power, data, and cooling. The long combined cable 14 may extend, for example, several kilometers, or any other suitable length. The multiple outputs of the splitter 13 run through short drop cables 17, which are shorter than the combined cable 14 and may be, for example, a few meters to a few hundred meters in length, or any other suitable length. The short cables 17 carry their share of power, data, and cooling and may be similar in construction to the long combined cables 14. The cables 17 may also be smaller in capacity and physical size than combined cable 14 to reduce costs.

One or more of the remote network devices 12 may also deliver power to equipment using PoE. For example, one or more of the network devices 12 may deliver power using PoE to electronic components such as IP (Internet Protocol) cameras, VoIP (Voice over IP) phones, video cameras, point-of-sale devices, security access control devices, residential devices, building automation devices, industrial automation, factory equipment, lights (building lights, streetlights), traffic signals, and many other electrical components and devices.

In one embodiment, one or more of the network devices 12 may comprise dual-role power ports that may be selectively configurable to operate as a PSE (Power Source Equipment) port to provide power to a connected device or as a PD (Powered Device) port to sink power from the connected device, and enable the reversal of energy flow under system control, as described in U.S. Pat. No. 9,531,551 ("Dynamically Configurable Power-Over-Ethernet Apparatus and Method", issued Dec. 27, 2016), for example. The dual-role power ports may be PoE or PoE+F ports, enabling them to negotiate their selection of either PoE or higher power PoE+F in order to match the configuration of the ports on line cards 16 with the corresponding ports on each remote network device 12, for example.

In one or more embodiments, there is no need for additional electrical wiring for the communications network and all of the network communications devices operate using the power provided by the PoE+F+C system. In other embodiments, in addition to the remote communications devices 12 configured to receive power, data, and cooling from the central hub 10, the network may also include one or more network devices comprising conventional network devices that only process and transmit data. These network devices receive electrical power from a local power source such as a wall outlet. Similarly, one or more network devices may eliminate the data interface, and only interconnect power (e.g., moving data interconnection to wireless networks). Also, one or more devices may be configured to receive only power and data, or only power and cooling, for example.

It is to be understood that the network devices and topology shown in FIG. 1 and described above are only examples and the embodiments described herein may be implemented in networks comprising different network topologies or a different number, type, or arrangement of network devices, without departing from the scope of the embodiments. For example, the network may comprise any number or type of network communications devices that facilitate passage of data over the network (e.g., routers, switches, gateways, controllers), network elements that operate as endpoints or hosts (e.g., servers, virtual machines, clients), and any number of network sites or domains in communication with any number of networks. Thus, network nodes may be used in any suitable network topology, which may include any number of servers, virtual machines, switches, routers, or other nodes interconnected to form a large and complex network, which may include cloud or fog computing. For example, the PoE+F+C system may be used in a fog node deployment in which computation, networking, and storage are moved from the cloud to locations much closer to IoT sensors and actuators. The fog nodes may provide power to PoE devices such as streetlights, traffic signals, 5G cells, access points, base stations, video cameras, or any other electronic device serving a smart building, smart city, or any other deployment.

Figure 2:
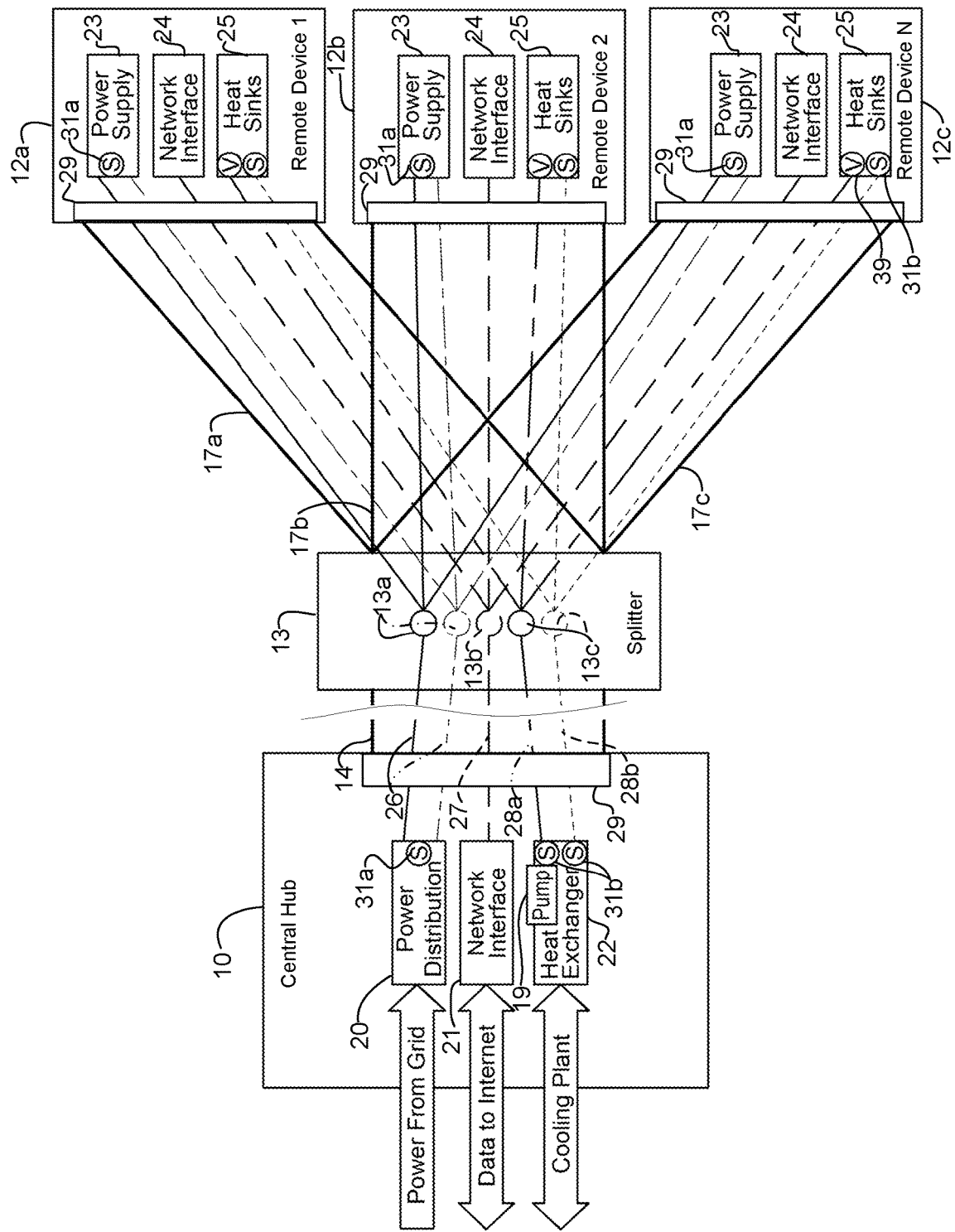
FIG. 2 illustrates an example of power, data, and cooling delivery from a central hub through a splitter to remote devices in the network of FIG. 1.

FIG. 2 schematically illustrates delivery of the power, data, and cooling through a PoE+F+C system comprising the central hub (central network device) 10, splitter device 13, and a plurality of remote communications devices 12a, 12b, 12c, in accordance with one embodiment. As described in detail below, the system further comprises distribution components, monitoring components, and a control system. Combined cable 14 transmits power, data, and cooling from the central hub 10 to the splitter 13 and combined cables 17a, 17b, and 17c deliver the power, data, and cooling from the splitter to the remote devices (Remote Device 1 (12a), Remote Device 2 (12b), Remote Device N (12c), respectively). As previously described, the cable 14 is longer than the cables 17a, 17b, 17c. For simplification, a section of the cable 14 is removed from FIG. 2 (as indicated by the gap in the cable).

The long combined cable 14 originates at the central hub 10 that provides utility services for the entire network of data connectivity, power distribution, and cooling. The splitter (e.g., passive intermediary distribution splitter) 13 is located near a physical center of a cluster of the remote devices 12a, 12b, 12c and comprises three splitting elements (depicted by circles (or pairs of circles) in FIG. 2). The splitting elements comprise power splices 13a (for splitting power received from power lines (wires) 26), an optical coupler 13b (for splitting data received on fiber 27 and combining data received from the remote devices 12a, 12b, 12c (e.g., using bidirectional fiber, as described below), and fluid manifolds 13c (for splitting supply flow received from coolant supply tube 28a and combining return coolant flow from the remote devices for delivery to the central hub 10 on coolant return tube 28b). The splitter 13 splits the power, data, and cooling N ways (e.g., 32 or any other number). In the example shown in FIG. 2, the power, data, and cooling are split three ways. The multiple outputs of the splitter 13 are run through short cables 17a, 17b, 17c (i.e., shorter than cable 14 running from central hub 10 to the splitter 13).

As shown in FIG. 2, the central hub 10 includes a power distribution module 20 for receiving power from a power grid, network interface 21 for receiving data from and transmitting data to a network (e.g., Internet), and a heat exchanger 22 for fluid communication with a cooling plant. The power distribution module 20 provides power to power supply modules 23 at the remote devices 12a, 12b, 12c. The network interface 21 at the central hub 10 is in communication with the network interfaces 24 at the remote devices 12a, 12b, 12c. The heat exchanger 22 at the central hub 10 forms a cooling loop with heat sinks 25 at the remote devices 12a, 12b, 12c.

In the example shown in FIG. 2, each cable 14, 17a, 17b, 17c includes two power lines (conductors) 26, one data line (optical fiber) 27, and two coolant tubes (supply 28a and return 28b) coupled to connectors 29 located at the central hub 10 and remote devices 12a, 12b, 12c. The splitter 13 may be connectorized or directly field terminate the combined cables 14, 17a, 17b, 17c.

In this example, a bidirectional optical system is utilized with one wavelength of light going downstream and a different wavelength of light going upstream, thereby reducing the fiber count in the cable from two to one (optical fiber 27 in FIG. 2). The closed coolant loop is established through the two coolant tubes 28a, 28b that share the same combined cable jacket with the fiber 27 that provides bidirectional data connectivity to the network and conductors 26 that provide power from the power grid. It is to be understood that that this is only an example and that the cables 14, 17a, 17b, 17c may contain any number of power, data, or cooling lines.

In one or more embodiments, sensors 31a monitor the current and voltage of the power delivery system at either end of the power conductors 26. As described below, this information may be used by the control system to adjust power or coolant delivery to one or more of the remote devices 12a, 12b, 12c.

The system further includes sensors 31b for measuring critical die temperatures, coolant temperatures, pressures, and flows within the cooling loop (e.g., at the central hub 10 and in each remote device 12a, 12b, 12c). In one or more embodiments, the sensors 31b monitor aggregate and individual branch coolant temperatures, pressures, and flow rate quantities at strategic points around the loop. In the example shown in FIG. 2, a servo valve 39 is located at the coolant input to each of the remote devices 12a, 12b, 12c. One or more valves 39 may be used to control the amount of cooling delivered at the remote devices 12a, 12b, 12c based upon their instantaneous needs, as described below.

The central hub 10 with heat exchanger 22 maintains a source of low-temperature coolant that is sent through distribution plumbing (such as a manifold), through the connector 29, and down the cable's coolant supply line 28a to the remote devices 12a, 12b, 12c. The coolant may comprise, for example, water, antifreeze, liquid or gaseous refrigerants, or mixed-phase coolants (partially changing from liquid to gas along the loop).

In an alternative embodiment, the heat exchanger may just be a distribution manifold (if the same physical coolant is used in the cooling plant as is transported in tubes 28a, 28b). The heat exchanger is needed if isolation is required, or if there is a liquid to gas interface.

The connectors 29 at the remote devices 12a, 12b, 12c are coupled to the cables 17a, 17b, or 17c, respectively, and the supply coolant is routed through elements inside the device such as heat sinks (heat exchangers, cooling taps, heat pipes) 25 that remove heat. The warmed coolant may be aggregated through a return manifold within device 12, and returned to the central hub 10 from the device's connector 29 and through the return coolant tube 28b in the cable 17a, 17b, 17c, fluid manifold in the splitter 13, and cable 14. The cable 14 returns the coolant to the central hub 10, where the return coolant passes through the heat exchanger 22 to remove the heat from the coolant loop to an external cooling plant, and the cycle repeats. The heat exchanger 22 may be a liquid-to-liquid heat exchanger, with the heat transferred to chilled water or a cooling tower circuit, for example. The heat exchanger 22 may also be a liquid-to-air heat exchanger, with fans provided to expel the waste heat to the atmosphere. The hot coolant returning from the cable 14 may be monitored by sensor 31b for temperature, pressure, and flow. Once the coolant has released its heat, it may pass back through a pump 19 and sensor, and then sent back out on the cooling loop. One or more variable-speed pumps 19 may be provided at the central hub 10 (or remote devices 12a, 12b, 12c) to circulate the fluid around the cooling loop.

In an alternate embodiment, only a single coolant tube is provided within the cables 14, 17a, 17b, 17c and high pressure air (e.g., supplied by a central compressor with an intercooler) is used as the coolant. When the air enters the remote device, it is allowed to expand and/or impinge directly on heat dissipating elements inside the device. Cooling may be accomplished by forced convection via the mass flow of the air and additional temperature reduction may be provided via a Joule-Thomson effect as the high pressure air expands to atmospheric pressure. Once the air has completed its cooling tasks, it can be exhausted to the atmosphere outside the remote device via a series of check valves and mufflers (not shown).

In cold environments the coolant may be supplied above ambient temperature to warm the remote devices 12a, 12b, 12c. This may be valuable where the remote devices 12a, 12b, 12c are located in cold climates or in cold parts of industrial plants, and the devices have cold-sensitive components such as optics or disk drives. This may be more energy efficient than providing electric heaters at each device, as is used in conventional systems.

The central hub 10 may also include one or more support systems to filter the coolant, supply fresh coolant, adjust anti-corrosion chemicals, bleed air from the loops, or fill and drain loops as needed for installation and maintenance of cables 14, 17a, 17b, 17c and remote devices 12a, 12b, 12c.

The connectors 29 at the central hub 10 and remote devices 12a, 12b, 12c (and similar connectors optionally equipped at the splitter 13) are configured to mate with the cables 14, 17a, 17b, 17c for transmitting and receiving combined power, data, and cooling. In one embodiment, the connectors 29 carry power, fiber, and coolant in the same connector body. The connectors 29 are preferably configured to mate and de-mate (couple, uncouple) easily by hand or robotic manipulator.

In order to prevent coolant leakage when the cables 14, 17a, 17b, 17c are uncoupled from the central hub 10 or remote devices 12a, 12b, 12c, the coolant lines 28a, 28b and connectors 29 preferably include valves (not shown) that automatically shut off flow into and out of the cable, and into and out of the device or hub. In one or more embodiments, the connector 29 may be configured to allow connection sequencing and feedback to occur. For example, electrical connections may not be made until a verified sealed coolant loop is established. The cable connectors 29 may also include visual or tactile evidence of whether a line is pressurized, thereby reducing the possibility of user installation or maintenance errors.

In one or more embodiments, a distributed control system comprising components located on the central hub's controller and on the remote device's processor may communicate over the fiber link 27 in the combined cables 14, 17a, 17b, 17c. Control systems for all three utilities interact between the remote devices 12a, 12b, 12c and the central hub 10 to ensure that each remote device receives its fair share of power, data, and cooling. For example, the cooling loop sensors 31b at the central hub 10 and remote devices 12a, 12b, 12c may be used in the control system to monitor temperature, pressure, flow, or any combination thereof. The servo valves 39 or variable speed pump 19 may be used to insure the rate of coolant flow matches requirements of the remote thermal loads. Monitoring information from power sensors 31a (e.g., current, voltage) or data usage (e.g., bandwidth, buffer/queue size) may also be used by the control system in managing cooling at the remote devices 12a, 12b, 12c. The control system also uses the monitoring information to allocate power and data, as described in detail below.

Machine learning may be used within the control system to compensate for the potentially long response times between when coolant flow rates change and the remote device's temperatures react to the change. The output of a control algorithm may be used to adjust the pumps 19 to move the correct volume of coolant to the devices 12a, 12b, 12c, and may also be used to adjust coolant valve settings within the remote devices to control the split ratio of coolant between remote devices 12a, 12b, 12c, and to direct different portions of the coolant to different internal heat sinks within each device to properly balance the use of coolant among a plurality of thermal loads.

The control system may also include one or more safety features. In one or more embodiments, the control system may be operable to monitor for abnormal or emergency conditions among power, data, or cooling, and react by adjusting power, data, or cooling to respond to the condition. For example, the control system may instantly stop the coolant flow and begin a purge cycle if the coolant flow leaving the central hub 10 does not closely match the flow received at the remote devices 12a, 12b, 12c, or the flow returned to the hub, which may indicate a leak in the system. The control system may also shut down one or more of the remote devices 12a, 12b, 12c if an internal temperature exceeds a predetermined high limit or open relief valves if pressure limits in the coolant loop are exceeded. The control system may also use its sensors 31b and machine learning algorithms to predictively detect problems in the cooling system, such as a pressure rise caused by a kink in the cables 14, 17a, 17b, 17c, reduction in thermal transfer caused by corrosion of heat sinks, or impending bearing failure in pump 19, before they become serious.

All three utilities (power, data, cooling) provided by the combined cables 14, 17a, 17b, 17c may interact with the control system to keep the system safe and efficient. For example, the power sensors 31a located in the power distribution module 20 of the central hub and power supply 23 of the remote devices 12a, 12b, 12c may provide input to the control system for use in modifying cooling delivery or power allocation. Initial system modeling and characterization may be used to provide expected power, flow properties, and thermal performance operating envelopes, which may provide an initial configuration for new devices and a reference for setting system warning and shut-down limits. This initial characteristic envelope may be improved and fine-tuned over time heuristically through machine learning and other techniques. For example, if the system detects additional power flow in power conductors 26 (e.g., due to a sudden load increase in the CPU (Central Processing Unit) in one of the remote devices 12a, 12b, 12c), the control system may proactively increase coolant flow in anticipation of an impending increase in heat sink temperature even before the temperature sensors 31b register it. This interlock between the various sensors 31a, 31b, control systems, and actuators such as pump 19 and valves 39 help to improve the overall responsivity and stability of the complete system.

In one or more embodiments, the central hub 10 may utilize control algorithms that know what proportion of bandwidth and power are being used by each of the remote devices 12a, 12b, 12c, and use this data to predict its energy and cooling needs. This may be used to ensure that the cooling and power capabilities remain in balance for each of the remote device's needs, and also are fairly allocated across the network. As previously noted, machine learning techniques may be employed to automatically establish system characteristic response times, thereby improving power and cooling control loops heuristically over time.

Additional details of splitting, monitoring, and controlling (managing, allocating) the power, data, and cooling and the control system are described further below with respect to FIGS. 4, 5, and 6.

As previously noted, the cables 14, 17a, 17b, 17c may comprise various configurations of power conductors, optical fiber, and coolant tubes. These components, along with one or more additional components that may be used to isolate selected elements from each other, manage thermal conductivity between the elements, provide thermal paths, or provide protection and strength, are contained within an outer jacket of the cable. The coolant tubes may have various cross-sectional shapes and arrangements, which may yield more space and thermally efficient cables. Supply and return tube wall material thermal conductivity may be adjusted to optimize overall system cooling.

The cable may also be configured to prevent heat loss through supply-return tube-tube conduction, external environment conduction, coolant tube-power conduction, or any combination of these or other conditions. For example, a thermal isolation material may be located between coolant tubes to prevent heat loss. The thermal isolation material may also be placed between the coolant tubes and the outer jacket. In another embodiment, one or both coolant tubes may be provided with a low thermal impedance path to the outside. Thermal paths may also be provided between the power conductors and one of the coolant tubes to use some of the cooling power of the loop to keep the power conductors in the cables cool.

In one or more embodiments, in order to reduce fluid frictional effects, tube interiors may be treated with hydrophobic coatings and the coolant may include surfactants. Also, the supply and return coolant tubes may be composed of materials having different conductive properties so that the complete cable assembly may be thermally tuned to enhance system performance. It is to be understood that the configuration, arrangement, and number of power wires, optical fibers, coolant tubes, and insulation regions, shields, coatings, or layers described herein are only examples and that other configurations or arrangements may be used without departing from the scope of the embodiments.

Figure 3:
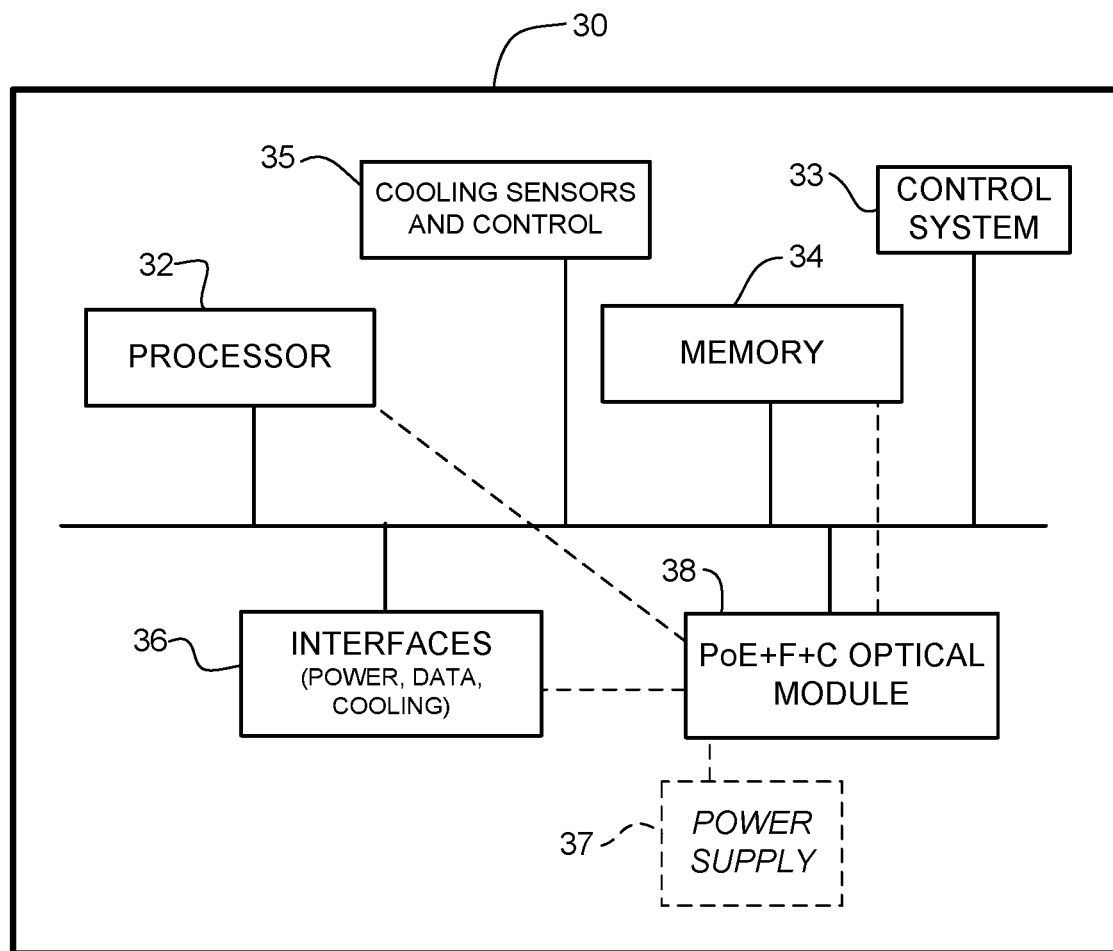
FIG. 3 depicts an example of a network device useful in implementing embodiments described herein.

FIG. 3 illustrates an example of a network device 30 (e.g., central hub 10, remote devices 12 in FIG. 1) that may be used to implement the embodiments described herein. In one embodiment, the network device 30 is a programmable machine that may be implemented in hardware, software, or any combination thereof. The network device 30 includes one or more processors 32, control system 33, memory 34, cooling components (pumps, valves, sensors) 35, and interfaces (electrical, optical, fluid) 36. In one or more embodiments, the network device 30 may include a PoE+F+C (or PoE+F) optical module 38 (e.g., optical module configured for receiving power from power supply 37 and data).

The network device 30 may include any number of processors 32 (e.g., single or multi-processor computing device or system), which may communicate with a forwarding engine or packet forwarder operable to process a packet or packet header. The processor 32 may receive instructions from a software application or module, which causes the processor to perform functions of one or more embodiments described herein. The processor 32 may also operate one or more components of the control system 33. The control system (controller) 33 may comprise components (modules, code, software, logic) located at the central hub 10 and the remote device 12, and interconnected through the combined cable 14, 17 (FIGS. 1 and 3). The cooling components 35 may include any number of sensors (power, data, or cooling (thermal, pressure, flow)) within the power distribution system, data network, or cooling loop to provide input to the control system 33. The control system 33 may also receive input from power sensors or data monitoring devices, as described below.

Memory 34 may be a volatile memory or non-volatile storage, which stores various applications, operating systems, modules, and data for execution and use by the processor 32. For example, components of the optical module 38, control logic for cooling components 35, or other parts of the control system 33 (e.g., code, logic, or firmware, etc.) may be stored in the memory 34. The network device 30 may include any number of memory components.

Logic may be encoded in one or more tangible media for execution by the processor 32. For example, the processor 32 may execute code stored in a computer-readable medium such as memory 34. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. Logic may be used to perform one or more functions described below with respect to the flowcharts of FIGS. 7 and 8 or other functions such as power level negotiations, safety subsystems, or thermal control, as described herein. The network device 30 may include any number of processors 32.

The interfaces 36 may comprise any number of interfaces (e.g., power, data, and fluid connectors, line cards, ports, combined power, data, and cooling connectors) for receiving power, data, and cooling, or transmitting power, data, and cooling to other devices. A network interface may be configured to transmit or receive data using a variety of different communications protocols and may include mechanical, electrical, and signaling circuitry for communicating data over physical links coupled to the network or wireless interfaces. One or more of the interfaces 36 may be configured for PoE+F+C, PoE+F, PoE, PoF (Power over Fiber), or similar operation.

The optical module 38 may comprise hardware or software for use in power detection, power monitor and control, or power enable/disable, as described below. The optical module 38 may further comprise one or more of the processor or memory components, or interface for receiving power and optical data from the cable at a fiber connector, for delivering power and signal data to the network device, or transmitting control signals to the power source, for example. Power may be supplied to the optical module by the power supply 37 and the optical module (e.g., PoE+F, PoE+F+C optical module) 38 may provide power to the rest of the components at the network device 30.

In one embodiment, the optical module 38 comprises an optical transceiver (optical module, optical device, optics module, transceiver, silicon photonics optical transceiver) configured to source or receive power and data, as described in U.S. patent application Ser. No. 15/707,976 ("Power Delivery Through an Optical System", filed Sep. 18, 2017), incorporated herein by reference in its entirety. The transceiver modules operate as an engine that bidirectionally converts optical signals to electrical signals or in general as an interface to the network element copper wire or optical fiber. In one or more embodiments, the optical transceiver may be a pluggable transceiver module in any form factor (e.g., SFP (Small Form-Factor Pluggable), QSFP (Quad Small Form-Factor Pluggable), CFP (C Form-Factor Pluggable), and the like), and may support data rates up to 400 Gbps, for example. Hosts for these pluggable optical modules include line cards on the central hub 10 or network devices 12 (FIG. 1). The host may include a printed circuit board (PCB) and electronic components and circuits operable to interface telecommunications lines in a telecommunications network. The host may be configured to perform one or more operations and receive any number or type of pluggable transceiver modules configured for transmitting and receiving signals.

The optical transceiver may also be configured for operation with AOC (Active Optical Cable) and form factors used in UWB (Ultra-Wideband) applications, including for example, Ultra HDMI (High-Definition Multimedia Interface), serial high bandwidth cables (e.g., thunderbolt), and other form factors. Also, it may be noted that the optical transceivers may be configured for operation in point-to-multipoint or multipoint-to-point topology. For example, QFSP may breakout to SFP+. One or more embodiments may be configured to allow for load shifting.

It is to be understood that the network device 30 shown in FIG. 3 and described above is only an example and that different configurations of network devices may be used. For example, the network device 30 may further include any suitable combination of hardware, software, algorithms, processors, devices, components, or elements operable to facilitate the capabilities described herein.

Figure 4:
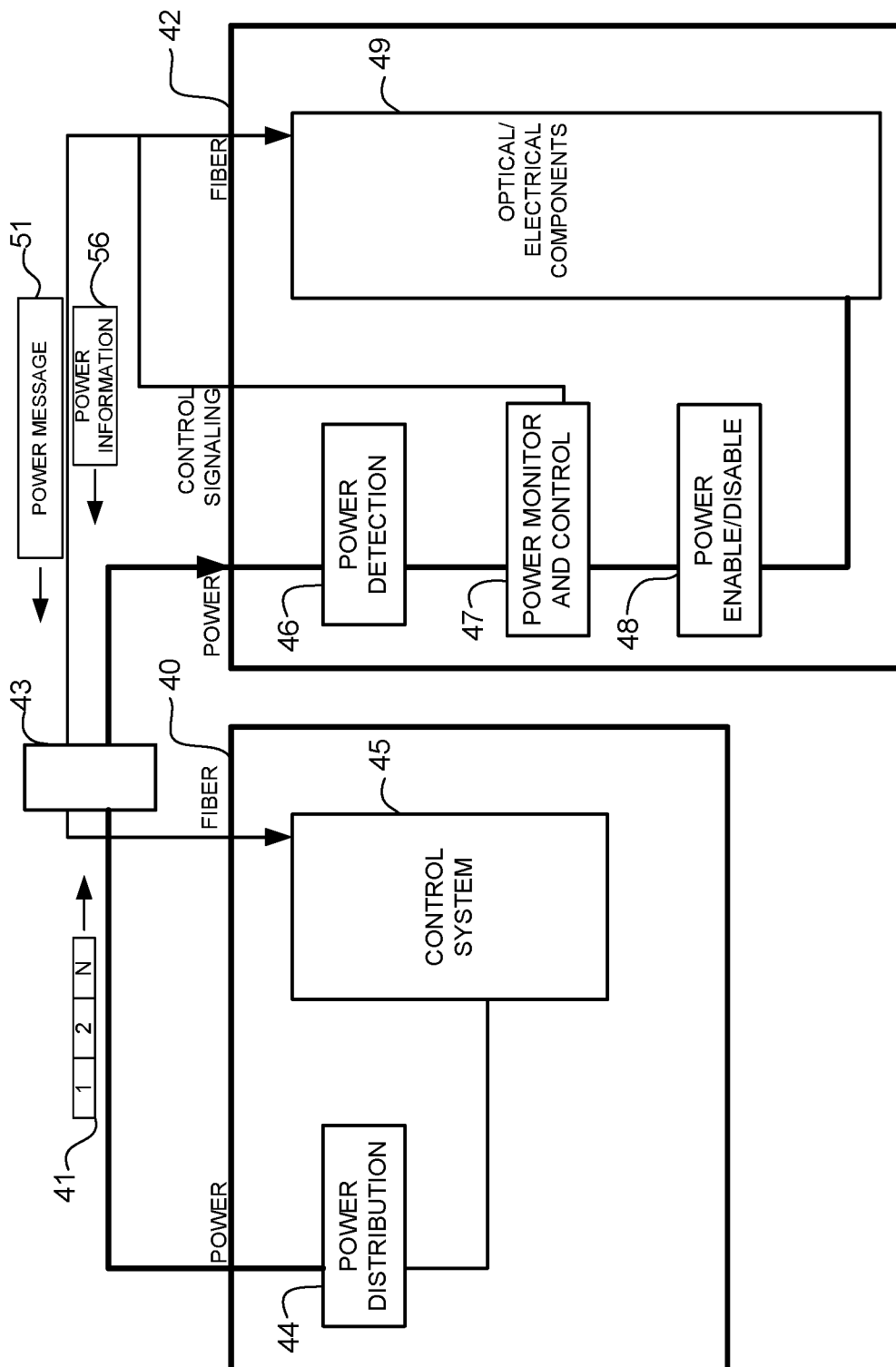
FIG. 4 is block diagram illustrating power monitoring and control, in accordance with one embodiment.
Figure 5:
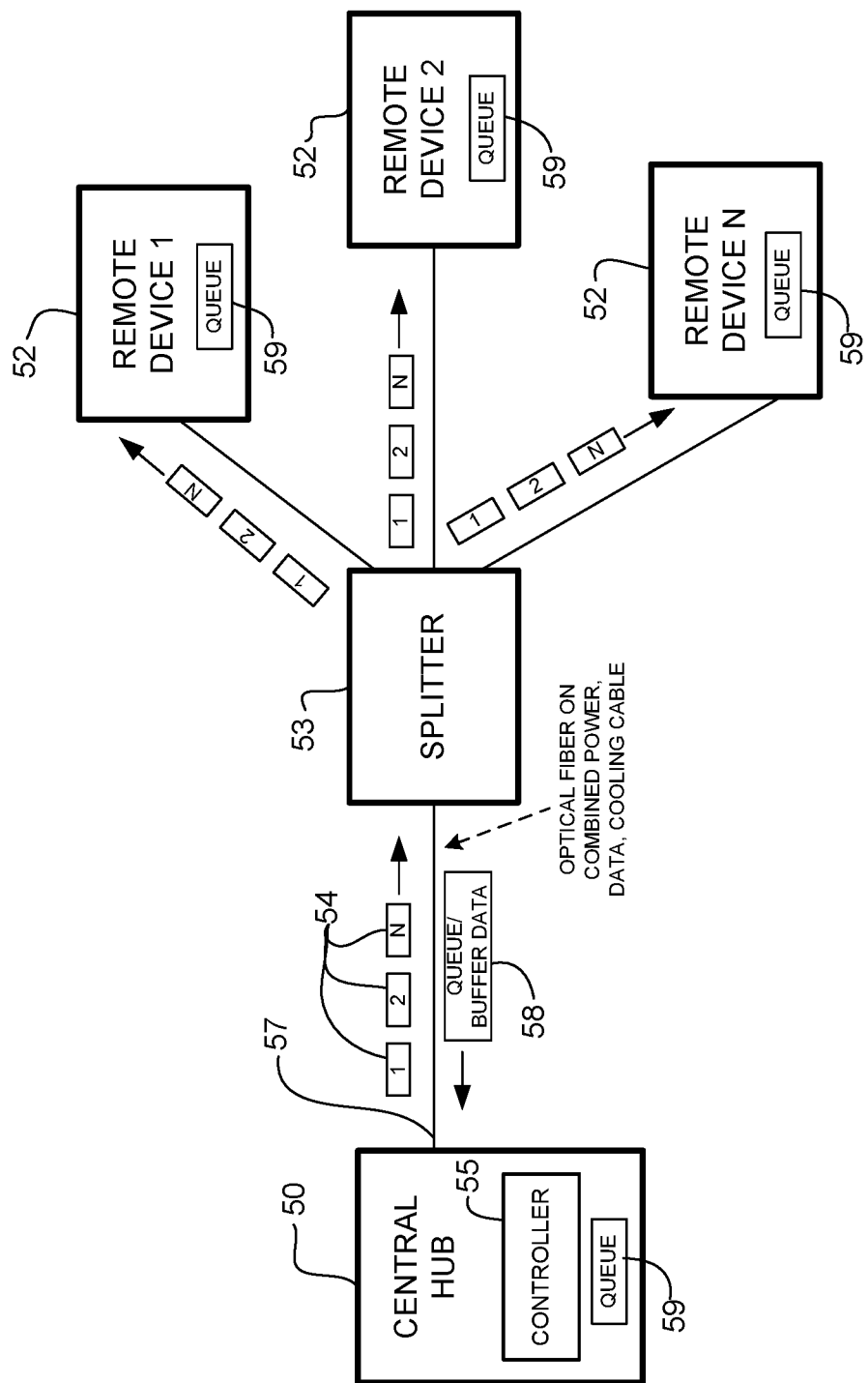
FIG. 5 is a block diagram illustrating delivery of optical data through the splitter, in accordance with one embodiment.
Figure 6:
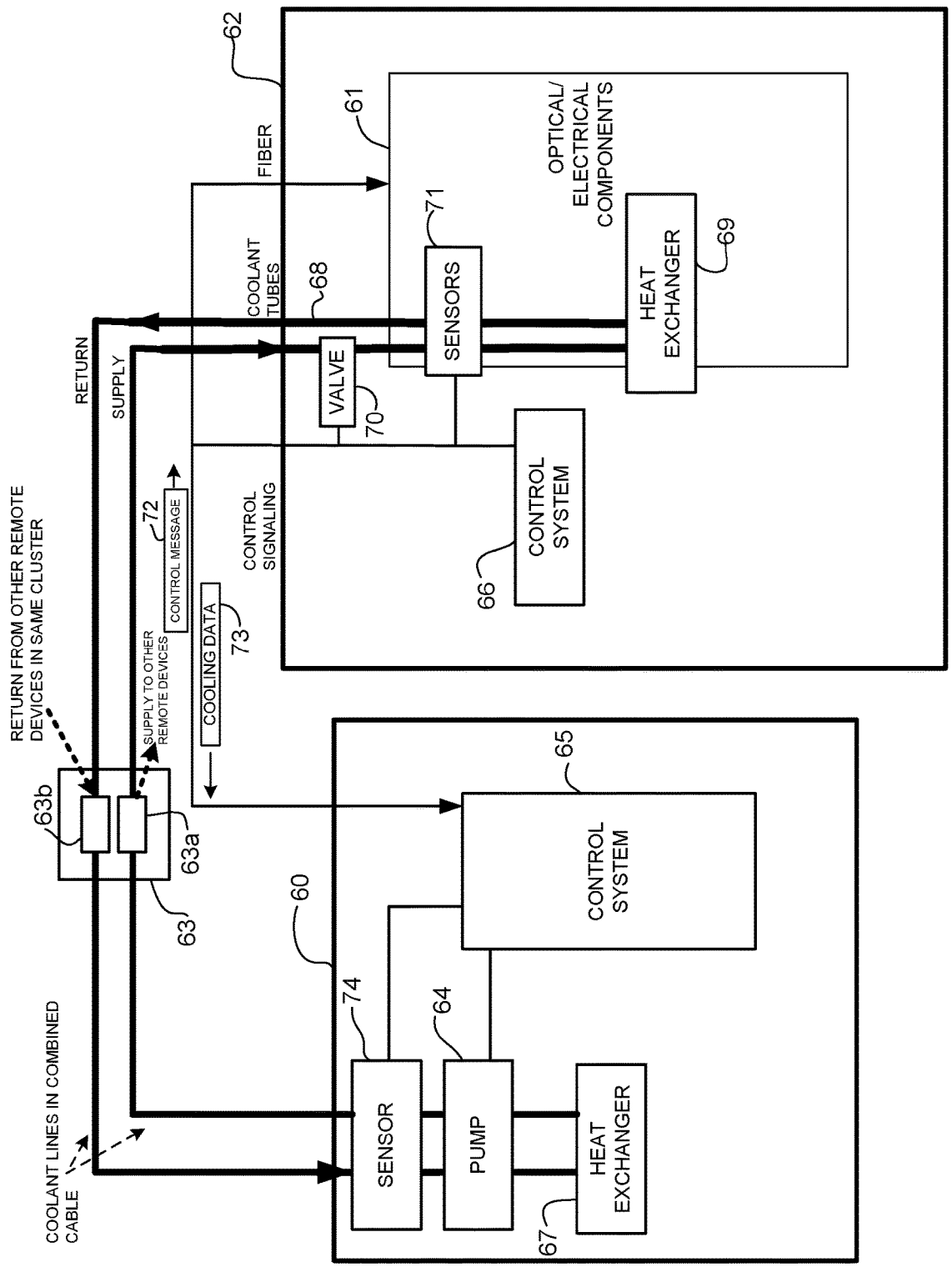
FIG. 6 is a block diagram illustrating cooling delivery, in accordance with one embodiment.

FIGS. 4, 5, and 6 illustrate details of the control system with respect to power, data, and cooling, respectively. As described below, the control system monitors and allocates power, data, and cooling based on calculations that take into account interactions between power, data, and cooling for each device and also the complex interactions and potential instabilities between remote devices sharing a common cable. Thus, even though the interactions between the control system for power, data, and cooling are shown and described separately below, it is to be understood that the control system may take into account the usage of power and data and the thermal conditions at the devices when making allocation decisions for power, data, or cooling.

FIG. 4 is a block diagram illustrating power monitoring and control at a central hub 40 and remote device 42, in accordance with one embodiment. For simplification, only one remote device 42 is shown downstream of splitter 43 and only power and data are shown. It is to be understood that the power and data are delivered together along with cooling in a combined cable, as described above with respect to FIGS. 1 and 2. In one embodiment, the splitter 43 comprises one or more passive power splitters (e.g., using IDCs (Insulation Displacement Connectors), terminal blocks, or wirenuts, for example). The central hub 40 includes a power distribution system 44 in communication with a control system 45. The control system 45 receives input from the remote device 42 via the data network (e.g., control signaling provided via optical fiber data path). As described below, system components provide for communication with the power source (power distribution system) 44 during power up of the powered device 42 and may also provide fault protection and detection.

The remote network device 42 includes optical/electrical components 49 for receiving optical data and converting it to electrical signals (or converting electrical signals to optical data) and power components including power detection module 46, power monitor and control unit 47, and power enable/disable module 48. The power components 46, 47, 48 may be isolated from the optical components 49 via an isolation component (e.g., isolation material or element), which electromagnetically isolates the power circuit from the optical components to prevent interference with operation of the optics.

In one or more embodiments, the electrical distribution system 44 comprises a pulsed power system set up with an interleave pattern, where each packet of energy 41 is directed to a different remote device, repeating after N packets. Each of the remote devices 42 receive all power packets from the combined cable, but only draw energy from the specific packets as needed and negotiated with a central energy manager (control system 45 at central hub 40), and would appear as a suitably high impedance load for all other packets. The remote devices 42 that need more energy than others have more power timeslots allocated to them in the interleave frame. As the remote device's power demands increase, its local energy reserves (e.g., hold up capacitor in its power supply 23 (FIG. 2)) that are constantly replenished by the flowing power packets 41 falls below a threshold level, and a message (packet 51) requesting more power timeslots is sent up the data channel (FIG. 4). If the local energy reserves are too high, a message requesting fewer power timeslots is sent.

In one embodiment, the system is integrated with an SMPS (Switched-Mode Power Supply) in a first stage power converter/isolator/pre-regulator in each remote device 42. If the remote device 42 needs more or less energy, it notifies the central hub 40 via the data network (power message 51), and the interleave pattern is dynamically tailored as needed.

The power detection module 46 may detect power, energize the optical components 49, and return a status message (packet 56 on optical channel) to the central hub 40. In one embodiment, power is not enabled by the power enable/disable module 48 until the optical transceiver and the source have determined that the device is properly connected and the remote device 42 to be powered is ready to be powered. In one embodiment, the remote device 42 is configured to calculate available power and prevent the cabling system from being energized when it should not be powered (e.g., during a cooling failure). The power detection module 46 may also be operable to detect the type of power applied to the remote device 42, determine if PoE or pulsed power is a more efficient power delivery method, and then use the selected power delivery mode. Additional modes may support other power+data standards (e.g., USB (Universal Serial Bus)).

The power monitor and control module 47 continuously monitors power delivery to ensure that the system can support the needed power delivery, and no safety limits (e.g., voltage, current, ground fault current, arc flash) are exceeded. The power monitor and control device 47 may also monitor optical signaling and disable power if there is a lack of optical transitions or communication with the power source. Temperature, pressure, or flow sensors (described below with respect to FIG. 6) may also provide input to the power monitor and control module 47 so that power may be disabled if the temperature at the remote device 42 exceeds a specified limit, or if coolant flow is inadequate. The power monitor and control module 47 may monitor power or collect power information from one or more sensors at the remote device, and send power information (e.g., current, voltage) (packet 56) to the control system 45 at the central network device 40. As described below, the power information may also be used by the control system 45 to determine cooling needs at the remote device 42.

FIG. 5 is a block diagram illustrating splitting of optical data at a splitter 53 in communication with a central hub 50 and a plurality of remote communications devices 52 (Remote Device 1, Remote Device 2, Remote Device N), in accordance with one embodiment. For simplification, the other services on the combined cable (power, cooling) are not shown in FIG. 5. The fiber optic splitter 53 is used to enable a single optical fiber 57 to serve multiple end points 52. The splitter 53 replicates traffic downstream to the remote devices 52 and combines end user traffic in the upstream direction (from remote devices 52 to central hub 50). For the optical data channel, different upstream and downstream timeslots are used by each remote device (indicated by packets 54), with devices needing more bandwidth using more timeslots, similar to operation of PONs (Passive Optical Networks). An alternate embodiment may assign one or more distinct optical wavelengths to each remote device 52, which are split and combined by splitter 53.

As the workload on a specific device 52 changes, its transmit buffers (e.g., at queue 59) feeding the upstream data channel, and the downstream buffers on the central hub 50 will fill and empty. A central controller 55 in the central network device 50 monitors the buffers for all remote devices 52, and the network adjusts rapidly by allocating more or less bandwidth by dedicating more or fewer timeslots on the network to each remote device 52. In one embodiment, a MAC (Media Access Control) protocol dynamically allocates portions of downstream bandwidth between the remote devices 52 and manages the timing of the upstream packets so that they interleave without interference. As shown in FIG. 5, data monitoring information (queue size, buffer status, bandwidth) is sent to the central hub 50 in packet 58 on the combined cable. The bandwidth information may also be used by the control system to determine energy and cooling needs at the remote devices 52, as bandwidth usage can be a good predictive indicator of computational load, and therefore future power and cooling demands on each remote device 52.

FIG. 6 is a block diagram illustrating a coolant loop 68 delivering coolant from central hub 60 to remote device 62, in accordance with one embodiment. In the simplified example shown in FIG. 6, only coolant lines (supply and return) are shown. As previously described, the coolant supply and return lines are contained in the combined cable with the power and data lines. A splitter 63 splits the coolant supply among a plurality of remote devices 62 and combines return coolant from the remote devices (additional supply and return lines at splitter 63 indicated by dashed lines).

The coolant loop 68 comprises a continuous loop of fluid from the central hub 60, through the splitter 63 and the remote devices 62, and back through splitter 63 to the central hub. In this example, the passive distribution splitter 63 comprises two fluid manifolds 63*a*, 63*b* for coolant supply and return, respectively. As described above, the distribution splitter 63 splits and recombines coolant flows (e.g., using 1:N and N:1 fluid distribution manifolds). If the system uses compressed air as a coolant, which is exhausted to the atmosphere at each remote device 62, only the supply manifold 63*a* is used.

Cooling is supplied to the device 62 via cooling (coolant) tubes in the cooling (coolant) loop 68, which provide cooling to the powered equipment through a heat exchanger (cooling tap, heat sink) 69 and returns warm (hot) coolant to the central hub 60. A heat exchanger 67 at the central hub 60 forms the cooling loop 68 with one or more heat exchangers 69 at the remote device 62. For the cooling flows, there may be one or more valves (e.g., servo valve) 70 at the coolant input to each remote device 62. As described below, the control system may adjust coolant valve settings to adjust the coolant flow at one or more of the remote devices.

Distribution plumbing routes the coolant in the cooling loop 68 to various thermal control elements within the network device 62 to actively regulate cooling through the individual flow paths. The remote device 62 may also include any number of distribution manifolds (not shown) with any number of outputs to route the coolant to one or more heat exchangers. If the manifold has multiple outputs, each may be equipped with a valve 70 to regulate the individual flow paths (e.g., adjust coolant valve settings). The distribution manifold may comprise any number of individual manifolds (e.g., supply and return manifolds) to provide any number of cooling branches directed to one or more components within the remote device 62.

Thermal control elements may include liquid cooled heatsinks, heat pipes, or other devices directly attached to the hottest components (e.g., CPUs (Central Processing Units), GPUs (Graphic Processing Units), power supplies, optical components, etc.) to directly remove their heat. The remote device 62 may also include channels in cold plates or in walls of the device's enclosure to cool anything they contact. Air to liquid heat exchangers, which may be augmented by a small internal fan, may be provided to cool the air inside a sealed box. Once the coolant passes through these elements and removes the device's heat, it may pass through additional temperature, pressure, or flow sensors, through another manifold, and out to the coolant return tube.

The coolant loop 68 at the remote device 62 may also include one more pumps (not shown) to help drive the coolant around the cooling loop or back to the central hub 60 or valves 70 to control flow in one or more branches of the cooling loop. The pump and valve 70 may be controlled by the control system 66 and operate based on control logic (message 72) received from the central hub 60 in response to monitoring at the remote device 62. The flow may be set by an active feedback loop that senses the temperature of a critical thermal load (e.g., the die temperature of a high power semiconductor) and continuously adjusts the flow in the loop that serves its heat exchanger 69.

The cooling loop 68 within the remote device 62 may include any number of sensors 71 for monitoring aggregate and individual branch temperature, pressure, and flow rate at strategic points around the loop (e.g., entering and leaving the device, at critical component locations). The remote device 62 may include, for example, temperature sensors to monitor die temperatures of critical semiconductors, temperatures of critical components (e.g., optical modules, disk drives), coolant temperatures, or the air temperature inside a device's sealed enclosure. The sensors 71 may also be used to check that the remote devices 62 receive approximately the same amount of coolant as supplied by the central hub 60 to help detect leaks or blockage in the cable, and confirm that the temperature and pressure are within specified limits. If, for example, a remote device's main CPU is running too hot, a message may be transmitted through the data channel requesting more coolant flow for the device 62. If the remote device 62 is cooler than required, a message to reduce coolant flow may be sent to economize on the total cooling used in the network. The control system may adjust the coolant flow to maintain a set point temperature. This feedback system insures the correct coolant flow is always present. Too much coolant flow wastes energy, while too little coolant flow may cause critical components in the remote devices 62 to overheat and prematurely fail.

As shown in the example of FIG. 6, the central hub 60 includes a control system 65 that receives input from sensors 71, 74 at the remote device 62 and the central hub, and may provide input to a pump 64 to control the flow of coolant in the cooling loop 68. The control system 65 also receives input from a monitor and control system 66 located at the remote device 62 via the data network (cooling data 73) over the optical fiber. As previously described, power and data usage at the remote devices 62 (as sensed and monitored by elements shown in FIGS. 4 and 5) may also be used by the control system 65 in allocating cooling to the remote devices. The settings of coolant valves 70 on all remote devices 62 are coordinated and controlled by the central hub 60, such that the pressures and flows to each remote device are carefully regulated and balanced so that each remote device receives an adequate share of the cable's total cooling capacity to keep its internal components at a safe temperature. For example, the coolant valves 70 may be fully open, partially closed, or adjusted at various flow settings to vary the flow of coolant at each device. The valves 70 at each of the remote devices 62 may be adjusted as soon as the cooling load on each device changes. The overall cooling power of the loop 68 may be regulated by the speed of the common pump 64 that circulates coolant for use by all of the remote devices 62.

It is to be understood that the network devices and control systems shown in FIGS. 4, 5, and 6 and described herein are only examples and that the network devices and control systems may include different components or arrangement of components, without departing from the scope of the embodiments. For example, the cooling system may include any number of pumps, manifolds, valves, heat sinks, heat exchangers, or sensors located in various locations within the coolant loop or arranged to cool various elements or portions of the device. Also, the network device may include any number of power sensors or control modules operable to communicate with the control system at the central hub to optimize power delivery and cooling at the network device. The network device may also comprise any number of queues or buffers for storing data and monitoring systems operable to monitor buffers or queue size to identify bandwidth requirements.

As described above with respect to FIGS. 4, 5, and 6, the central hub's control processor (control system 45, 55, 65) plays an important role in the coordination of data, power and cooling for all remote devices. The central hub periodically (e.g., at least tens of times per second or any other suitable interval) receives multiple sensor readings associated with all N remote devices served by the combined distribution cable. These readings may include, for example, current and voltage measurements at both the hub and remote devices for the power, transmit and receive queue sizes for the data channel, and temperature, pressure, and flow readings at both ends of the coolant distribution tubes. The controller performs detailed control loop calculations to determine set-points (settings) for the various control actuators (pumps, valves, power control device (timeslot allocation), bandwidth controller (bandwidth allocation)) in the system. These calculations may be assisted through the use of artificial intelligence or machine learning techniques, as previously described. The calculations also take into account the many interactions between data, power, and cooling for each of the remote devices, and also the complex interactions and potential instabilities between devices sharing a loop. The results of the calculations actuate control devices in the distribution system operable to recalculate the interleave pattern for power packets 41 (FIG. 4), recalculate the passive optical network timeslot allocation 54 (FIG. 5), or modify the coolant pump 64 and valve 70 setting (FIG. 6) for one or more of the remote devices. The data channel creates closed-loop communication paths between the sensors, central control algorithms, and actuators.

Figure 7:
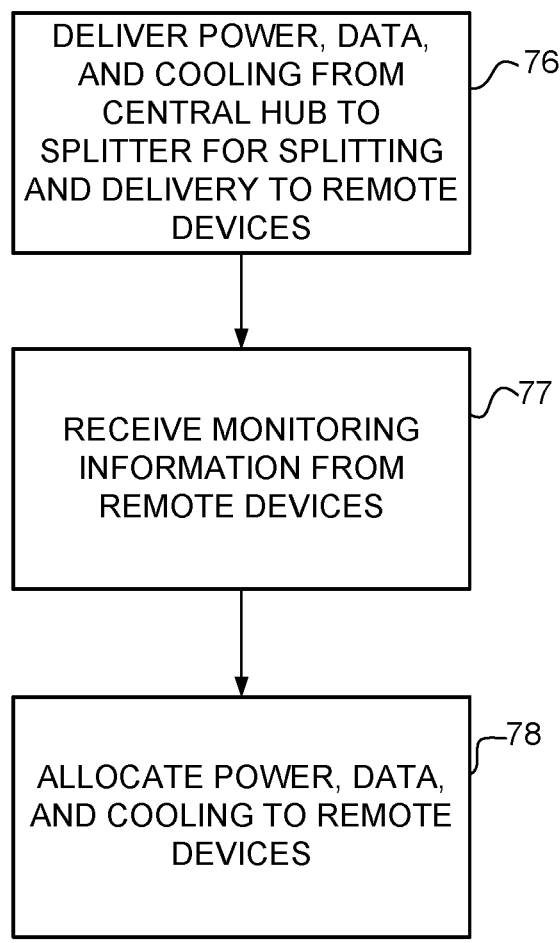
FIG. 7 is a flowchart illustrating an overview of a process for delivering combined power, data, and cooling using a splitter in a communications network, in accordance with one embodiment.

FIG. 7 is a flowchart illustrating an overview of a process for splitting delivery of combined power, data, and cooling in a communications network, in accordance with one embodiment. At step 76, the central network device 10 delivers power, data, and cooling on the combined cable 14 to the splitter device 13 for splitting and transmitting the power, data, and cooling to the plurality of remote communications devices 12 over the combined cables 17 (FIGS. 1 and 7). The central network device 10 receives monitoring information from the remote communications devices 12 on the cable 14 (step 77). The central network device 10 processes the monitoring information and allocates power, data, and cooling to each of the remote communications devices 10 (step 78). As previously described, the monitoring information comprises data collected at the remote devices 12 and may include, for example, voltage and current for power, bandwidth or queue size for data, and temperature, pressure, and flow rate for cooling.

Figure 8:
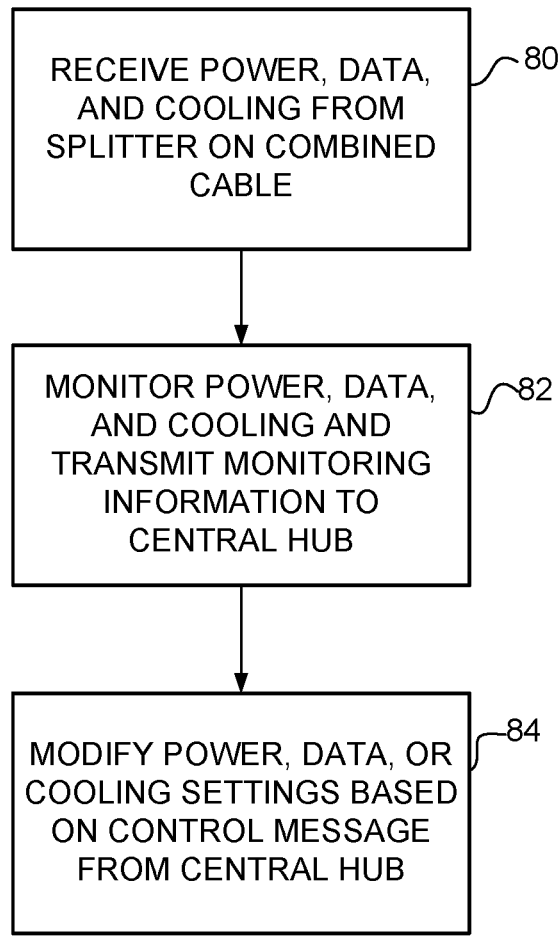
FIG. 8 is a flowchart illustrating a process for modifying settings for power, data, and cooling received through a splitter at a communications device, in accordance with one embodiment.

FIG. 8 is a flowchart illustrating an overview of a process for modifying settings for power, data, and cooling received through a splitter at a communications device, in accordance with one embodiment. At step 80, the communications device 12 receives power, data, and cooling from the splitter 13 on the combined cable 17 (FIGS. 1 and 8). The communications device 12 monitors power, data, and cooling and transmits the information to the central network device 10 (step 82). At least one of power, data, and cooling settings are modified in response to a control system message from the central network device allocating the power, data, and cooling to the communications devices (step 84). The control system message may be used to dynamically modify settings at the central hub 10, remote communications device 12, or both the central hub and one or more of the remote communications devices. The settings include, for example, cooling valve settings, power interleave pattern, or timeslots to change the bandwidth allocation.

It is to be understood that the processes shown in FIGS. 7 and 8 are only examples and that steps may be added, removed, combined, or modified, without departing from the scope of the embodiments.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. A method comprising:
   delivering power and data on a cable from a central network device to a splitter device for splitting and transmitting said power and data to a plurality of remote communications devices over a plurality of cables, each of the cables carrying said power and data;
   receiving at the central network device, monitoring information from said plurality of remote communications devices on the cable, said monitoring information comprising power usage and data usage;
   processing said monitoring information;
   allocating said power and data to each of said plurality of remote communications devices based on said monitoring information; and
   transmitting a message from the central network device to a controller at one of said plurality of remote communications devices to adjust one of said power usage or said data usage based on said monitoring information;
   wherein said power and data comprises pulsed power and optical data and wherein the central network device is operable to switch from the pulsed power to Power over Ethernet based on said monitoring information.

2. The method of claim 1 wherein said monitoring information further comprises thermal data and wherein said power usage is adjusted based on said thermal data.

3. The method of claim 1 wherein said monitoring information comprises at least one of current and voltage for power, and queue size for data.

4. The method of claim 1 wherein power is delivered on a plurality of conductors and control data is transmitted on at least one of said conductors.

5. The method of claim 4 wherein said monitoring information is received on at least one of said conductors.

6. The method of claim 1 further comprising recalculating an interleave pattern for power packets based on power measurements at said plurality of remote communications devices.

7. The method of claim 1 further comprising adjusting a timeslot allocation for data based on queue sizes at said plurality of remote communications devices.

8. The method of claim 1 wherein the splitter device comprises a passive splitter device and further comprising balancing needs of said plurality of remote communications devices at a control system of the central network device.

9. The method of claim 1 further comprising delivering said power and data from the central network device to a plurality of splitter devices, each of the splitter devices in communication with a cluster of said remote communications devices.

10. The method of claim 1 further comprising utilizing system modeling to identify an initial operating configuration and adjusting power and data allocation utilizing machine learning and said monitoring information.

11. The method of claim 1 further comprising delivering coolant on the cable and wherein said monitoring information comprises temperature data and flow or pressure data for the coolant.

12. The method of claim 1 further comprising identifying an abnormal condition in said power and data and adjusting a power delivery mode in response to said identified abnormal condition.

13. The method of claim 1 wherein receiving said monitoring information comprises receiving said monitoring information on a bidirectional optical fiber delivering data on the cable.

14. The method of claim 1 wherein delivering said power and data comprises delivering power at a level greater than 100 watts.

15. A method comprising:
   receiving at a communications device, power and data from a splitter device receiving said power and data on a cable from a central network device and splitting said power and data among a plurality of communications devices;
   monitoring said power and data at the communications device;
   transmitting monitoring information to the central network device through the splitter device on the cable, said monitoring information comprising power usage and data usage; and
   modifying at least a power setting or a data setting in response to a control system message from the central network device allocating said power and data to the communications devices;
   wherein said power and data comprises pulsed power and optical data and wherein the communications device is operable to switch from the pulsed power to Power over Ethernet.

16. The method of claim 15 further comprising transmitting a power message requesting additional power timeslots in an interleave pattern of power packets based on power measurements at the communications device.

17. The method of claim 15 further comprising enabling the pulse power after testing a power circuit at the communications device.

18. A system comprising:
   a central network device comprising a connector for connection to a cable delivering power and data to a splitter device for splitting said power and data for delivery to a plurality of remote communications devices over a plurality of cables, each of the cables carrying said power and data;

said plurality of remote communications devices comprising sensors for monitoring said power and data and operable to transmit power and data information to the central network device, said monitoring information comprising power usage and data usage; and a control system for receiving said power and data information from said plurality of remote communications devices, allocating said power and data to said plurality of remote communications devices, and transmitting a message to a controller at one of said plurality of remote communications devices to adjust one of said power usage or said data usage based on said monitoring information;

wherein said power and data comprises pulsed power and optical data and wherein the central network device is operable to switch from the pulsed power to Power over Ethernet based on said monitoring information.

19. The system of claim 18 wherein the splitter device comprises a passive splitter device operable to split power among said plurality of remote communications devices and split data comprising optical energy among said plurality of remote communications devices.

20. The system of claim 18 wherein allocating said power and data to said plurality of remote communications devices comprises modifying an interleave pattern for power packets on the cable or modifying a timeslot allocation for data on the cable for one or more of said plurality of remote communications devices.

\* \* \* \* \*